United States Patent [19]

Schoettl et al.

[11] Patent Number: 5,671,122
[45] Date of Patent: Sep. 23, 1997

[54] ELECTRONIC CONTROL UNIT

[75] Inventors: Johannes Schoettl, Obertraubling; Reinhard Lindner, Regensburg, both of Germany

[73] Assignee: Siemens Akitiengesellschaft, Munich, Germany

[21] Appl. No.: 449,435

[22] Filed: May 24, 1995

Related U.S. Application Data

[62] Division of Ser. No. 126,340, Sep. 24, 1993, Pat. No. 5,473,509.

[30] Foreign Application Priority Data

Sep. 24, 1992 [DE] Germany ............... 42 32 048.8

[51] Int. Cl.⁶ ..................................................... H05K 7/20
[52] U.S. Cl. ........................... 361/715; 361/719; 361/720
[58] Field of Search ........................... 174/16.3; 361/689, 361/694, 704, 707, 709-722, 729-732, 736, 752, 759, 785; 220/4.02, 4.24; 439/76, 638, 640

[56] References Cited

U.S. PATENT DOCUMENTS

| | | |
|---|---|---|
| 3,631,299 | 12/1971 | Meyer et al. . |
| 3,950,603 | 4/1976 | Brefka . |
| 4,226,491 | 10/1980 | Kazama et al. . |
| 4,310,870 | 1/1982 | Kia et al. . |
| 4,652,969 | 3/1987 | Stegenga . |
| 4,929,137 | 5/1990 | Bossenmaier . |
| 5,109,318 | 4/1992 | Funari et al. . |
| 5,111,362 | 5/1992 | Flamm et al. . |
| 5,258,888 | 11/1993 | Koriashy . |

FOREIGN PATENT DOCUMENTS

| | | |
|---|---|---|
| 3515772 | 11/1986 | Germany . |
| 3933647 | 4/1991 | Germany . |
| 3639870 | 1/1992 | Germany . |

OTHER PUBLICATIONS

"Heat Sink Assembly For Tab-Mounted Device", IBM Technical Disclosure Bulletin, vol. 31, No. 6, Nov. 1988, pp. 372-373 (361/720).

*Primary Examiner*—Gregory D. Thompson
*Attorney, Agent, or Firm*—Herbert L. Lerner; Laurence A. Greenberg

[57] ABSTRACT

A housing of an electronic control unit includes two identically constructed housing parts and at least one plug part fastened between the housing parts. The housing parts and the at least one plug part enclose an interior. A printed wiring board, optionally at least one cooling baffle and power components are disposed in the interior. The power components are disposed directly on the printed wiring board or on the at least one cooling baffle. The printed wiring board or the at least one cooling baffle is in thermal contact with one of the housing parts, for dissipating heat produced by the power components to the outside through the housing.

5 Claims, 2 Drawing Sheets

ELECTRONIC CONTROL UNIT

This is a division of application Ser. No. 08/126,340, filed Sep. 24, 1993 now U.S. Pat. No. 5,473,509.

BACKGROUND OF THE INVETNION

Field of the Invention

The invention relates to an electronic control unit, particularly an ABS control unit for a motor vehicle, having a housing in which a printed wiring board, that carries an electronic circuit and power components, are disposed.

A control unit, which is known from German Published, Non-Prosecuted Application DE 39 33 084 A1, has a housing in which two tub-shaped housing parts are secured to a supporting frame and thus seal off the interior of the housing. One of the housing parts is penetrated by a plug part that is electrically connected to a printed wiring board.

That control unit has the disadvantage of being very complicated in structure. The housing parts are constructed differently and must be secured to the supporting frame in order to seal off the housing interior. All of the parts are secured to one another by screws or rivets. Expensive tools are also necessary to produce the different mechanical housing parts.

SUMMARY OF THE INVENTION

It is accordingly an object of the invention to provide an electronic control unit, which overcomes the hereinafore-mentioned disadvantages of the heretofore-known devices of this general type and which is simple in structure and easy to mount.

With the foregoing and other objects in view there is provided, in accordance with the invention, a housing of an electronic control unit, comprising two identically constructed housing parts and at least one plug part fastened between the housing parts, the housing parts and the at least one plug part enclosing an interior; a printed wiring board, optionally at least one cooling baffle and power components disposed in the interior; the power components being disposed directly on the printed wiring board or on the at least one cooling baffle; and the printed wiring board or the at least one cooling baffle being in thermal contact with one of the housing parts, for dissipating heat produced by the power components to the outside through the housing.

In this case the housing includes only two identically constructed housing parts, which are secured directly to one another in the mounted state. The housing parts include a plug part and close the housing interior. Due to the fully identical housing parts, easy mounting is possible and can be largely automated. The plug part is likewise easy to mount.

In accordance with another feature of the invention, the two housing parts are interlocked in one another. Since the housing parts are interlocked with one another, the housing can be opened at any time.

In accordance with a further feature of the invention, the housing parts have rivet shanks being deformed for permanently securing the housing parts to one another. Riveting the housing parts produces a simply constructed, permanently leakproof housing.

In accordance with an added feature of the invention, the housing parts have tabs being bent over or twisted for securing the printed wiring board to the housing. The printed wiring board can be secured to the housing without difficulty by bending or twisting the tabs.

In accordance with a concomitant feature of the invention, the at least one cooling baffle is secured to the printed wiring board. Through the use of cooling baffles, which can easily be varied in their thickness and therefore in their thermal capacity, the ensuing heat loss can be simply dissipated to the housing, without expensive fastening elements.

Other features which are considered as characteristic for the invention are set forth in the appended claims.

Although the invention is illustrated and described herein as embodied in an electronic control unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
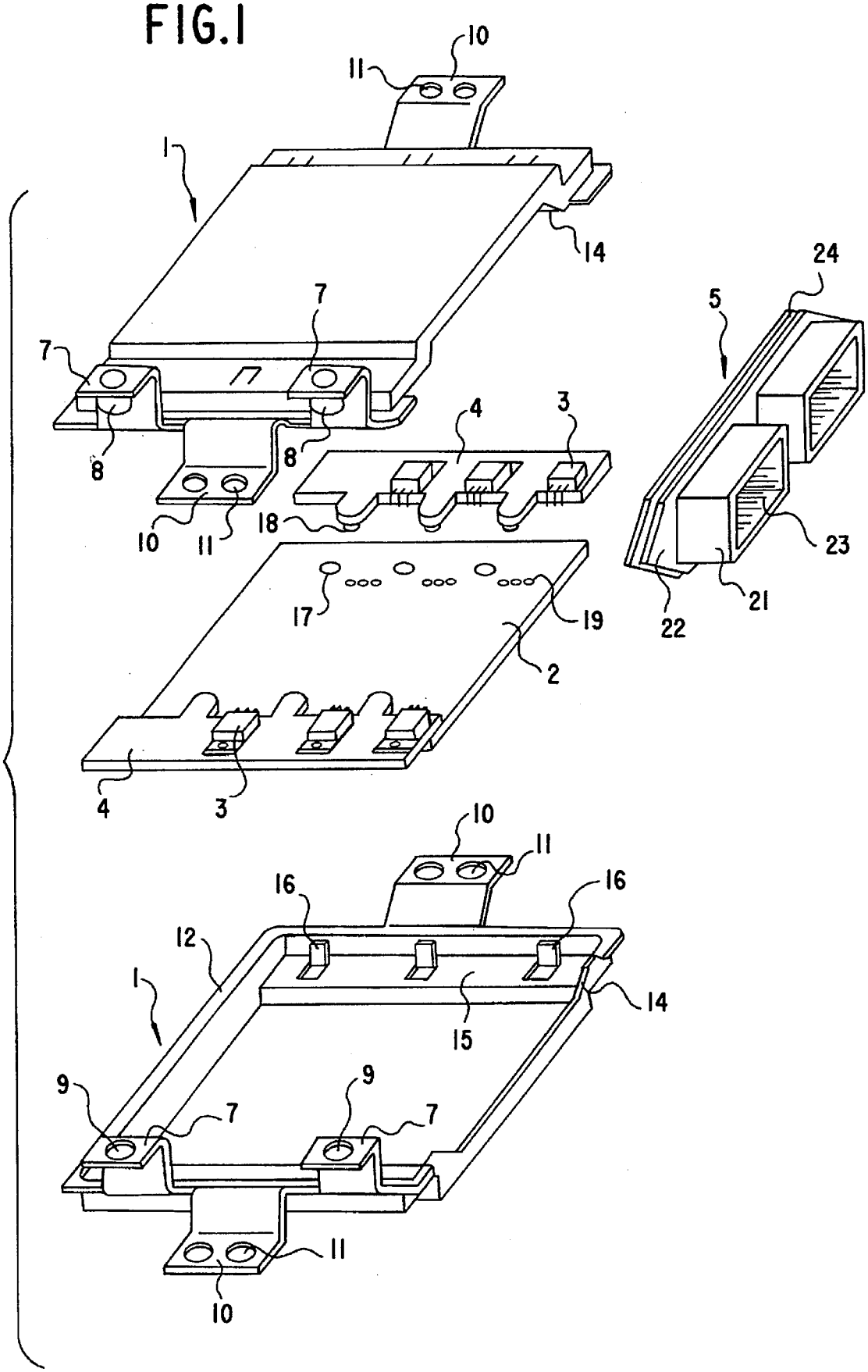
FIG. 1 is an exploded, diagrammatic, perspective view of a control unit according to the invention.

Referring now to the figures of the drawing in detail and first, particularly, to FIG. 1 thereof, there is seen an electronic control unit, for instance an ABS control unit of a motor vehicle, which has a housing that includes two identically constructed housing parts 1. In a mounted state, the housing parts 1 enclose a printed wiring board 2 that carries a circuit. As in this exemplary embodiment, power components 3 may be disposed separately from the circuit on cooling baffles 4, or may be disposed directly on the printed wiring board 2. A plug part 5 that is electrically connected to the printed wiring board 2 is likewise enclosed by the housing. Next, rivet shanks 8 are deformed, and the two housing parts 1 are permanently secured to one another.

The housing parts 1 are tub-shaped and are constructed identically. Each housing part 1 has fastening tabs 7 that are bent at an angle on two opposed side walls of the housing part 1. On one side wall, the fastening tabs 7 are provided with the rivet shanks 8 or non-illustrated detent elements, and on the opposite side wall they are provided with bores 9. When the housing is mounted, the housing parts 1 are joined together in such a way that the rivet shanks 8 or the detent elements of the fastening tabs 7 of one housing part 1 are passed through the corresponding bores 9 in the fastening tabs 7 of the other housing part 1.

The housing part 1 also has likewise angled housing fastening tabs 10 on both side walls, with two bores 11 disposed in the tabs. The control unit can be secured with the aid of the housing fastening tabs 10 through the use of non-illustrated screws or rivets, for instance in the passenger compartment or in the engine compartment of a motor vehicle.

The housing parts 1 are pressed together to such an extent that flanges 12, which are disposed all the way around the edges of each housing part 1, are joined tightly together. However, a recess 14 is provided for the plug part 5 on one side wall of the housing part 1. This recess 14 is penetrated by the plug part 5 once the housing is joined together.

The housing parts 1 also have steps or shoulders 15, which are used to support and hold the cooling baffles 4 or the printed wiring board 2 in the mounted state. In order to fasten the cooling baffles 4 or the printed wiring board 2, the housing parts 1 have tabs 16, which are either bent over or twisted for that purpose in the mounted state of the housing. Thus the printed wiring board 2 or the cooling baffles 4 are pressed against the housing, and heat loss produced by the power components 3 can be dissipated to the outside through the cooling baffles 4 and the housing.

The printed wiring board 2 is assembled with conventional components in a known manner and soldered. The printed wiring board 2 also has bores 17 into which rivet shanks 18 of the cooling baffle 4 are inserted. The cooling baffle 4 is secured to the printed wiring board 2 by deformation of the rivet shanks 18.

The power components 3 are adhesively bonded or screwed to the cooling baffle 4 so that the power loss can be well dissipated to the cooling baffle 4. Electrical connections of the power components 3 are inserted through suitable bores 19 in the printed wiring board 2 during the mounting process and then soldered. Non-illustrated electrically insulating, heat-conductive insulating foils, which electrically insulate the power components 3 from the cooling baffle 4 may be disposed between the power components 3 and the cooling baffle 4.

If the power loss generated by the power components 3 is very low, then the cooling baffles 4 may be omitted. In that case, the power components 3 are adhesively bonded or soldered directly to the printed wiring board 2, for instance in the form of SMDs. The printed wiring board 2 in that case rests directly on the steps 15 of the housing part 1. However, a further insulating foil between the printed wiring board 2 and the housing part 1 may be necessary, in order to insulate these two elements electrically from one another.

The heat dissipation of the power components 3 soldered to the printed wiring board 2 takes place by means of through holes under the power components 3, which carry the heat to the underside of the printed wiring board 2. From there, the power loss can be dissipated to the housing through large-area or generally flat coatings on the underside of the printed wiring board 2 and through the insulating foils.

Figure 4:
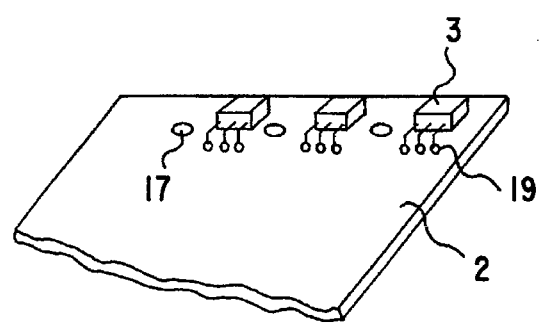
FIG. 4 is a fragmentary front, top, perspective view of an embodiment in which the power components are disposed directly on the printed circuit board.

In the case of the invention, however, it is unimportant whether the power components 3 are mounted on the cooling baffle 4 or directly on the printed wiring board 2, the latter embodiment being shown in FIG. 4. This depends on the quantity of lost heat that must be dissipated. The cooling baffles 4 are used whenever the heat loss is major and occurs cyclically.

The plug part 5 is integrally made from plastic. In this exemplary embodiment the plug part 5 is constructed with a plug base plate 22 and with two plug housings 21, which are constructed as knife contacts and can be connected to non-illustrated counterpart plugs. Plug prongs 23 are passed through the base plate 22 and are electrically connected to the printed wiring board 2.

Figure 3:
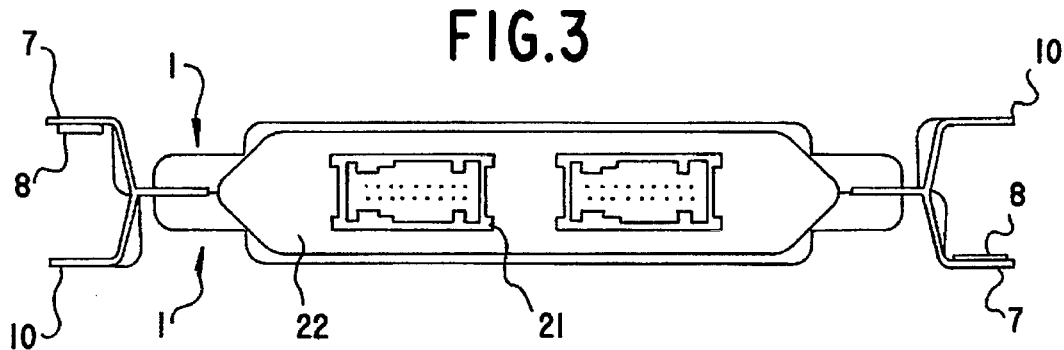
FIG. 3 is a side-elevational view of the control unit of FIG. 1 in the mounted state.

When mounting the housing, the plug part 5 is secured to the printed wiring board 2 by riveting or interlocking non-illustrated plastic stubs together. When the housing parts 1 are joined together, one part of one side wall of each of the housing parts 1 is inserted into a groove 24 in the base plate 22. The plug part 5 is thus tightly surrounded and forms a part of the side wall of the housing. FIG. 3 should be referred to in this regard. A plurality of plug parts 5 that are separate from one another can also be disposed in one housing.

Figure 2:
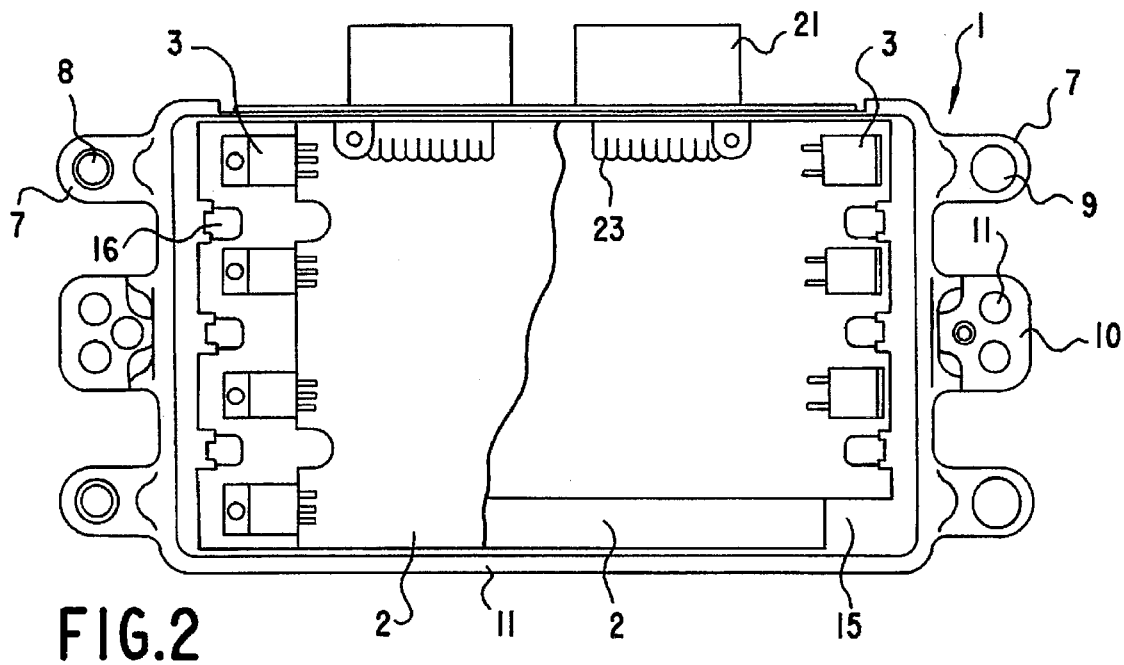
FIG. 2 is a plan view of a control unit in accordance with FIG. 1 that is open on top.

FIG. 2 shows a plan view of an opened control unit. The spatial configuration of the fastening tabs 7, 10 and the housing 21 of the plug part 5 can be seen clearly. In the control unit, the power components 3 may be disposed both on the cooling baffles 4 and on the printed wiring board 2. It is also possible for two printed wiring boards 2 to be disposed in one housing. These variants are diagrammatically shown in FIG. 2.

FIG. 3 shows a side view of the control unit. The housing is fully mounted, and the housing parts 1 encompass the plug part 5. This view shows the alternating configuration of the housing fastening tabs 10 and the fastening tabs 7. The housing fastening tabs 10 are bent downward on one side wall in the drawing and upward on the opposite side wall, while the fastening tabs 7 are bent upward and downward, respectively. This figure also shows that the housing of the control unit is constructed to be quite flat, and when installed in the engine compartment it can be mounted after being rotated through 180° as desired.

The housing parts i are made in the form of deep-drawn parts of metal, for instance aluminum.

We claim:

1. A housing of an electronic control unit, comprising:

two identically constructed housing parts and at least one plug part fastened between said housing parts, said housing parts and said at least one plug part defining an enclosed interior;

a printed wiring board and power components disposed entirely inside said interior;

said power components being disposed directly on and being electrically connected to said printed wiring board; and said printed wiring board being in thermal contact with one of said housing parts, for dissipating heat produced by said power components to the outside through the housing.

2. The housing according to claim 1, wherein said two housing parts are interlocked in one another.

3. The housing according to claim 1, wherein said housing parts have rivet shanks being deformed for permanently securing said housing parts to one another.

4. The housing according to claim 1, wherein said housing parts have tabs being bent over or twisted for securing said printed wiring board to the housing.

5. The housing according to claim 1, wherein said plug part is integrally made of plastic material and has plug prongs passing through said plastic material and electrically connected to said printed wiring board.

* * * * *

UNITED STATES PATENT AND TRADEMARK OFFICE
CERTIFICATE OF CORRECTION

PATENT NO. : 5,671,122
DATED      : September 23, 1997
INVENTOR(S) : Johannes Schoettl et al.

It is certified that error appears in the above-identified patent and that said Letters Patent is hereby corrected as shown below:

On the title page item [73], should read as follows:

Siemens Aktiengesellschaft

Signed and Sealed this

Thirty-first Day of March, 1998

*Attest:*

BRUCE LEHMAN

*Attesting Officer*     *Commissioner of Patents and Trademarks*